United States Patent [19]

Flanders

[11] Patent Number: 5,276,963
[45] Date of Patent: Jan. 11, 1994

[54] PROCESS FOR OBTAINING SIDE METALLIZATION AND ARTICLES PRODUCED THEREBY

[75] Inventor: Michael W. Flanders, Hixson, Tenn.

[73] Assignee: Coors Electronic Package Company, Chattanooga, Tenn.

[21] Appl. No.: 839,501

[22] Filed: Feb. 21, 1992

[51] Int. Cl.$^5$ ............................ H01K 3/10; H05K 1/00
[52] U.S. Cl. ........................................ 29/852; 29/830; 174/261; 174/262; 264/61; 428/901
[58] Field of Search ............... 264/61; 29/830, 423, 29/424, 852; 428/901; 156/89; 174/261, 262

[56] References Cited

U.S. PATENT DOCUMENTS

| | | | |
|---|---|---|---|
| 4,213,004 | 7/1980 | Acker et al. | 174/151 |
| 4,416,156 | 11/1983 | Demark et al. | 73/727 |
| 4,487,999 | 12/1984 | Baird et al. | 174/52 |
| 4,488,673 | 12/1984 | Hopper, Jr. | 228/122 |
| 4,790,894 | 12/1988 | Homma et al. | 428/901 X |
| 4,821,007 | 4/1989 | Fields et al. | 333/238 |
| 4,899,118 | 2/1990 | Polinski, Sr. | 333/246 |

OTHER PUBLICATIONS

IBM Technical Disclosure Bulletin vol. 23, No. 12, May 1981 pp. 5595-5597 by R. E. Gegenwarth et al.
IBM Technical Disclosure Bulletin vol. 10, No. 11, Apr. 1968 pp. 1663-1664 by D. A. Chance et al.
"The Use of Multilayer Ceramic Inserts For Total Mitigation of the Cracked Bead Problem" by Jerry Carter, Hybrid Circuit Technology, Oct., 1990, pp. 43-46.
"Multilayer Ceramic", Newsbreakers, Hybrid Circuit Technology, Jun. 1990, p. 6.
"IN-MMIC-ABLE", Advertisement, Hybrid Circuit Technology, Oct., 1988, p. 69.

Primary Examiner—Carl J. Arbes
Attorney, Agent, or Firm—Sheridan Ross & McIntosh

[57] ABSTRACT

A process for the formation of side metallization in ceramic sheets is provided by the present invention. The process includes the steps of forming a via within the ceramic sheet and splitting the via to expose the metallization contained therein. The process is particularly useful for forming wraparound metallization on feedthroughs utilized in hermetic packages.

20 Claims, 1 Drawing Sheet

PROCESS FOR OBTAINING SIDE METALLIZATION AND ARTICLES PRODUCED THEREBY

FIELD OF THE INVENTION

The present invention relates to a method for obtaining side metallization on the vertical edges of single layer or multilayer articles, and the articles produced thereby. More particularly, the present invention relates to an improved method for forming side metallization that is especially useful for manufacturing hermetic ceramic package feedthroughs.

BACKGROUND OF THE INVENTION

Electronic packages are devices that provide connection and communication between "chips" located inside the package and devices located outside of the package. Often, these packages are hermetically sealed to protect the chips from contaminants in the surrounding environment. The outer walls of the hermetic package are typically fabricated from a metallic material, such as KOVAR ™, (Westinghouse Electric Corp., E. Pittsburgh, Pa. 15235), an iron-nickel-cobalt alloy having a thermal expansion coefficient close to that of hard glass.

Hermetic metal packages must be capable of accommodating electrical communication through the walls of the package with little or no interference. This creates a design problem because the electrical communication lines must be sufficiently insulated from the metal walls of the package to avoid any type of interference. At the same time, the hermeticity of the package must be maintained to protect the internal components.

Traditionally, glass seals have been utilized to insulate conductors from the conductive walls of hermetic packages. Matched glass seals are widely used and much effort has been directed to improving their reliability.

The electronics industry is now able to put more devices on a chip to form integrated circuits, and able to put more chips, integrated circuits, and passive components into a single hermetic package to form a "hybrid" circuit. These hybrid circuits require large packages with high lead counts, i.e. a large number of input and output leads. These leads must be well insulated from the package walls, and also must be well insulated from each other. The leads often have a very fine pitch, that is, they are spaced closely adjacent to each other, which compounds the problem.

Glass seals are often an ineffective way to insulate conductor paths in these devices. Glass seals, particularly glass bead seals, are susceptible to cracks that can ruin the hermeticity of the package. If the probability of a crack is about 1 in 2000 seals, the impact on acceptable yields for a three lead device having three glass seals is relatively minor. But if the package requires 100 or more leads, as is often the case on currently produced hybrid circuits, then this same crack probability will significantly lower the yield of acceptable packages.

One solution to this problem is the use of a multilayer, co-fired ceramic feedthrough. This type of feedthrough has a much higher survivability rate through the normal assembly, testing, handling, and product life. Further, polycrystalline ceramic is much stronger than glass. This construction can also utilize many refined manufacturing techniques for multilayer ceramics.

A hermetic package designed to receive a ceramic feedthrough is typically constructed with a thermally conductive floor, e.g., copper-tungsten or molybdenum, and a metal wall with slots into which the feedthrough is brazed or soldered to provide a hermetic seal. Alternatively, the floor and walls can be fabricated from a single piece that is obtainable using powder metallurgy sintering techniques, in which case the slot for the feedthrough is molded into the case. In all instances, the feedthrough requires a band of metallization completely wrapped around the periphery of the feedthrough to form a continuous surface suitable for a hermetic braze/solder seal.

The production of feedthroughs for hermetic packages thus requires the ability to form "wraparound" metallization. The wraparound metallization provides a continuous braze-wettable surface around the feedthrough. The feedthrough can then be inserted into the package so that the wraparound metallization is surrounded by the slot in the wall of the package, enabling the feedthrough to be brazed into place, forming a substantially hermetic seal.

U.S. Pat. No. 4,416,156 by Demark et al., issued Nov. 22, 1983, discloses an electrical feedthrough for a high pressure housing that includes a ceramic circuit assembly having a metallized bonding area on the surface of the ceramic that enables the ceramic assembly to be brazed to an outer support housing. The bonding area is in the form of a collar for bonding the ceramic feedthrough to the pressure housing to provide a fluid tight seal therebetween. There is no disclosure as to how the bonding area collar is formed around the ceramic.

U.S. Pat. No. 4,487,999 by Baird et al., issued on Dec. 11, 1984, discloses an all-metal microwave chip carrier with ceramic feedthroughs, wherein the feedthroughs are configured to function as coaxial cables having predetermined impedances. The feedthroughs are formed by providing ceramic tubing metallized inside and out, in which the ends are cut away to provide half cylindrical bonding pads.

The upper and lower planar surfaces of a feedthrough, or any similar article, can be metallized by conventional screen-printing techniques while the substrate material is in the green (unfired) state. However, the vertical surfaces cannot be metallized until they are exposed by cutting, breaking or punching the ceramic card or sheet from which they are formed. The side metallization thus requires the additional manufacturing step such as screen printing the vertical sides of the part in either the fired or unfired stage.

Often, the side metallization must be applied manually, which is a labor-intensive, high-cost processing step. Since a single card can contain hundreds of small feedthroughs, each of which must be metallized on two sides, this additional step presents a major handling problem. The advantages of array processing (i.e. forming large numbers of small parts in one array) are therefore lost. Further, when the side metallization is applied by the above-identified techniques, the feedthrough edges cannot be subsequently ground or machined to reach a final dimension, since this would tend to remove the thin metallization layer.

It would be advantageous if the additional manufacturing step of applying side metallization could be eliminated. It would be particularly advantageous if the side metallization could be formed during conventional process steps and permit the use of array processing. It would also be advantageous if the part having the side metallization could be machined after applying the side metallization without completely removing the side metallization.

SUMMARY OF THE INVENTION

According to the present invention, a process for the fabrication of a ceramic article having side metallization is provided. In one embodiment, the process includes the steps of forming at least one via in a ceramic sheet, substantially filling the via with metallization, and dividing the ceramic sheet wherein the via is split to form a ceramic sheet having side metallization. The dividing step can be achieved by scoring the ceramic sheet and breaking through the vias, or by cutting the ceramic sheet. In one embodiment, the split occurs substantially through the center of the via. In another embodiment, the via is substantially rectangular.

The ceramic material useful in the practice of the present invention can include alumina, aluminum nitride, cordierite, mullite or beryllia. Glass ceramics and glass plus ceramics can also be used.

According to another embodiment of the present invention, a process for the fabrication of a feedthrough for a hermetic package is provided. The process includes the steps of stacking at least two ceramic sheets, forming at least two vias within the sheets, substantially filling the vias with metallization, and splitting the vias to form side metallization.

According to another embodiment of the present invention, a multilayer ceramic device is provided that includes at least two ceramic sheets and a via extending substantially through the two ceramic sheets, wherein the via is split to expose metallization contained in the via.

DESCRIPTION OF PREFERRED EMBODIMENTS

Figure 1:
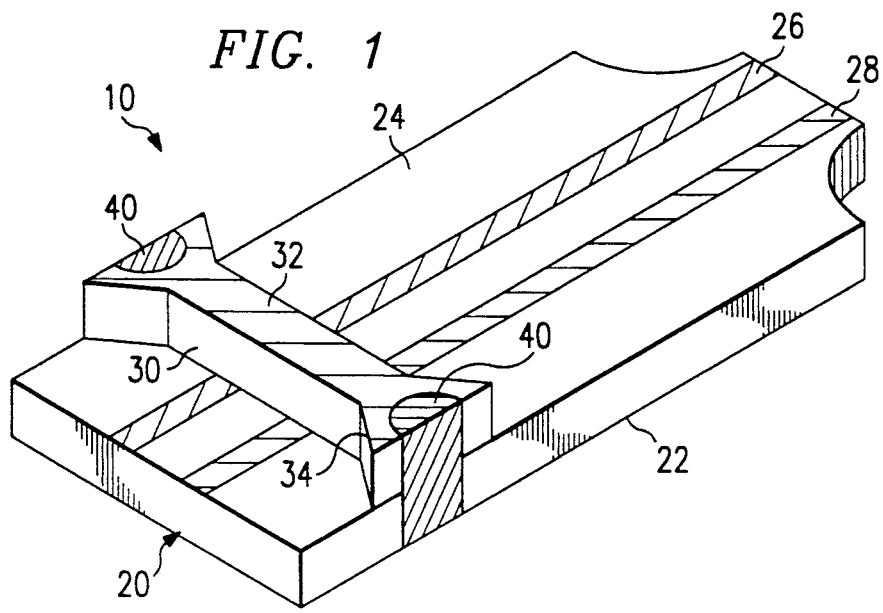
FIG. 1 illustrates a simplified version of a feedthrough fabricated in accordance with the present invention.

According to the present invention, ceramic articles having side metallization are fabricated by substantially filling at least one via formed in a ceramic sheet with metallization, and thereafter splitting the via to expose the metallization. As used herein, the term split or splitting can include, but are not limited to, sawing, cutting, breaking or perforating. The ceramic article can be a single layer substrate or can include a plurality of layers. In a preferred embodiment, the ceramic article is a feedthrough for a hermetic package.

Ceramic feedthroughs are commonly formed from two layers of ceramic sheet laminated upon one another. In a standard configuration, the underside of the bottom layer is fully metallized. The top surface of the bottom layer has at least one metal trace printed on its surface that provides electrical signal transmission through the package wall. The top layer can preferably be configured as a rib, laminated across the metal trace, that provides an insulative layer between the trace and the upper walls of the hermetic package. Preferably, the rib is substantially perpendicular to the trace.

Alternatively, the ceramic feedthrough may be fabricated from a plurality of ceramic sheets that are sequentially stacked and laminated. This configuration can advantageously accommodate a larger number of electrical traces through the package wall by placing the electrical traces on individual layers. The feedthrough may also have connection pins and the like on its surface.

According to the present invention, the ceramic sheets are preferably formed by ceramic tape processing. The tape casting process includes the steps of casting a slurry onto a moving carrier surface, such as cellulose acetate, teflon, mylar or cellophane, and spreading the slurry to a controlled thickness with the edge of a blade. The cast slurry is then dried, resulting in a thin flexible tape that can be cut or stamped to a desired configuration.

Additives are introduced into the slurry prior to casting to control the properties of the final tape. For example, deflocculants, solvents, binders and plasticizers may be added to the ceramic material to provide the tape with desirable flexibility and handling properties.

Although tape casting is a preferred method of fabrication, other methods for forming the ceramic sheet may be utilized in accordance with the present invention. For example, individual ceramic sheets can be dry pressed or a plastic ceramic body can be extruded through a narrow die to form a ceramic sheet. Ceramic tape can also be manufactured by a roll compaction process wherein a powder/binder mixture is fed through rollers having the desired gap between the rollers for thickness control.

According to the present invention, the ceramic sheet preferably has a thickness of from about 0.002 inch to about 0.040 inch (0.05 mm to about 1.0 mm), more preferably the ceramic sheet has a thickness of from about 0.010 inch to about 0.025 inch (0.25 mm to about 0.64 mm). Alternatively, a plurality of ceramic sheets can be stacked and laminated to create a sheet having the desired final thickness. The tape thickness is one factor that determines the impedance of a feedthrough having a given dielectric constant and conductive trace width. The impedance must be controlled in many package applications. Alternatively, other electrically insulating materials, besides ceramics, can be used for the feedthrough. For example, an amorphous (non-crystallized) glass can be used according to the present invention.

The ceramic sheet can include any ceramic material that is useful for forming the article, such as a feedthrough. The ceramic material can include, but is not limited to, alumina ($Al_2O_3$), aluminum nitride (AlN), cordierite ($Mg_2Al_4Si_5O_{18}$), mullite ($Al_6Si_2O_{13}$) forsterite ($Mg_2SiO_4$), ferrite (e.g., Ni. Zn ferrite) and beryllia (BeO). Alternatively, glass-ceramics or a glass plus ceramic composite (i.e., a composite of ceramic particles bonded by a continuous glass phase) can also be utilized. In one embodiment, the ceramic material in the ceramic sheet includes at least about 92 percent alumina. In another embodiment, a glass-ceramic composition that sinters at a low temperature is used. Glass-ceramic compositions are particularly useful since they can be easily tailored to yield specific properties, such as thermal expansion or dielectric constant.

The ceramic sheets are preferably metallized in the green state. That is, the metallic conductor traces are preferably applied and the vias are formed and filled prior to the sintering of the ceramic sheets. In a more preferred embodiment, the vias are formed prior to the metallization step.

Vias can be formed in the ceramic sheet by any method known in the art. For example, the vias may be formed in the sheet using a mechanical punch. In this instance, a male punch that includes pins extending from a planar surface is punched through the ceramic sheet into a female die having holes matching the location of the male punch pins. The male and female die blocks are aligned and are typically attached to a die set with position alignment posts. This permits the male punch to cycle vertically over the female. The die set may then be placed in a mechanical or hydraulic press which forces the punch pins through the unfired ceramic tape. To fabricate a via pattern the die is opened, a ceramic sheet is inserted between the die blocks, and the male array of punches is forced through the sheet, piercing the sheet and pushing slugs of the sheet into the female die.

Alternatively, the vias can be formed by a programmable punch, wherein the via pattern is programmed into a numerically controlled punch and the punch then fabricates each via individually. The programmable punch apparatus typically has a single punch which can be activated at a speed of about ten punches per second. Another alternative is the use of laser drilling apparatus. A laser drilling apparatus can form vias at a rate of about 40 vias per second.

In one embodiment of the present invention, the vias for forming the side metallization have a substantially circular configuration, since this is the least expensive configuration to produce. When the vias that will be split to form the side metallization are substantially circular, they preferably have a diameter of from about 0.003 inch to about 0.028 inch (0.076 to about 0.71 mm). More preferably, the vias have a one to one ratio of diameter to height.

In a preferred embodiment of the present invention, substantially rectangular vias are preferred. As used herein, the term rectangular vias can include rectangular vias with rounded corners or elongated ovals. Rectangular vias can advantageously provide stress reduction during subsequent firing operations and the long slots can be easily filled with metallization. Long rectangular vias can be utilized and still permit adequate via-filling and handling provided the width of the via is close to the tape thickness. Rectangular slots of about 1 inch by about 0.020 inch, or larger, are attainable utilizing, for example, a 0.015 inch thick tape. The corners of such a rectangular via can have a radius of about 0.005 inch. Other vias can be punched into the sheet for interconnection purposes and for the placement of pins into the device.

When the metallization is applied after the via punching, the metallization process can include both the filling of the vias and the metallization of the planar surfaces of the ceramic sheet. One or both sides of the ceramic sheet can be metallized. Some surfaces may be completely metallized, while others may have traces, or conductor paths, placed on their surface.

The metallization is typically applied in a screening process. In the screening process, a permeable screen, stencil or mask is used that permits a paste that includes the metal particles to pass through a desired location when a squeegee or similar device is run over the top surface of the screen. The squeegee forces the metal paste through selected areas of the screen and onto selected areas of the ceramic sheet. Alternatively, a roller can be used in place of the squeegee to force the metal paste through the screen.

Individual patterns for different layers can be formed in the screens by techniques such as photolithography. In this process, a liquid emulsion is applied in sequential layers to a stretched screen until a smooth, uniform coat has been achieved. After drying, the emulsion is exposed to the photographic positive of the printing image. Areas of the emulsion exposed to light become hardened due to the cross-linking of the polymer, but unexposed areas remain soft and are then washed out of the screen.

The metallization utilized in the present process can be any metallization that is useful for forming conductive traces and filling vias. Typically, the metallization will include a refractory metal which permits the ceramic and the metallization to be co-fired. In a preferred embodiment, the metallization includes molybdenum. Alternatively, metals such as tungsten, platinum or palladium can be used. Low temperature co-fired ceramic can advantageously use lower temperature metals such as copper, gold and silver for via filling metals. Very small vias, for example about 0.005 inch diameter (0.13 mm), can typically survive a thermal expansion coefficient mismatch with essentially pure metal. However, larger vias, those over about 0.010 inch (0.25 mm), are usually filled with a modified metal/filler paste to adjust the coefficient of thermal expansion. Electrical conductivity is usually degraded by the filler, since the filler (e.g. $Al_2O_3$) decreases the amount of metal in the via. However, the lower stresses observed with the split vias of the present invention will advantageously permit higher percentages of metal.

After the metallization has been selectively applied, the sheets can be heated to dry the metallization paste. For example, the sheets can be dried at about 75° C. for about two hours.

After the metallization has dried sufficiently, the ceramic sheets can be laminated upon one another, if the article is a multilayer device. In this process, the sheets are carefully stacked into a lamination fixture and laminated together in a large, precision flat-plate press. During stacking, care must be taken to get each layer in its proper position and orientation in the stack. The lamination process can occur, for example, at about 90° C. (194° F.) and at about 16.5 MPa (600 psi) of pressure.

The layers thus become a green, laminated, multilayer ceramic sheet. Prior to sintering, portions may be cut from the laminated array to permit discarding of the border containing any alignment or index holes. The edges of the green sheets may be lightly sanded or otherwise smoothed to eliminate sharp corners and burrs. The green sheets can also be inspected for contamination, voids, or other surface damage prior to sintering.

The green ceramic sheets can then be punched or otherwise cut to form the desired article. For example, in one embodiment, the article is a two-layer feedthrough wherein the top layer has a rib configuration. The rib can be formed by removing undesired portions of the top layer by punching, laser-forming, or the like. Depending on design, the vias may be formed after lamination and then metal filled. The ceramic rib should be formed in a single sheet or in a laminated sheet prior to laminating the rib to the metallized base sheet. However, the vias at the end of the rib can be formed after lamination to the base sheet, since the same hole pattern is formed in all layers.

The vias that are metal filled are preferably sufficiently longer than the width of the top cross rib to insure a width equivalent to the rib width. For example, in one embodiment, the dimensions of the rectangular via are 0.020 inch wide by 0.062 inch long with a 0.005 inch radii in the corners of the via. The 0.062 inch length is sufficiently longer than the 0.048 inch wide rib to insure that the side metallization is not the limiting width for brazing into a package.

According to one embodiment of the present invention, the ceramic green sheets are split to expose selected vias and create a ceramic sheet having side metallization. Preferably, when a substantially circular via is used, the split traverses the via substantially through the center of the via. If the split deviates significantly from the center, chipping of the surrounding ceramic material may occur. Surprisingly, it has been found that the via metallization does not have a tendency to pull away from the ceramic surface when the via is split.

If a rectangular via is used, the preferred traverse of the via will leave the desired minimum metal thickness and length to provide good surface metal overlap. A nominal overlap prevents small edge chipping of the via from creating voids in the metallization.

In an alternative embodiment, the ceramic green sheets may be scored or perforated when in the green state and the individual articles separated after the sintering step, discussed below, by snapping the pieces apart.

During the sintering cycle, the binders are broken down and volatilized, and the metallization and ceramics sinter into a fully dense article. The furnace can be either a continuous type or a periodic (i.e., batch) type. Preferably, the furnace is a continuous type for economic reasons. Typically, the oxygen level of the atmosphere in the furnace is controlled to burn out the binders contained in the ceramic sheets and prevent the loss of oxides from the ceramic material. At the same time, the atmosphere should be sufficiently reducing to prevent excessive oxidation of the metallization.

The article is typically sintered at between about 1450° C. and about 1650° C. for about one to four hours to fully densify the article. The exact time and temperature will vary depending on the ceramic material and refractory metal composition. For example, glass-ceramic materials will typically require lower sintering temperatures.

After sintering, the article can be plated with, for example, nickel, gold or tin solder prior to further processing. The plating improves the solderability of the wraparound metallization by permitting the solder material to wet the surface. In a more preferred embodiment, a layer of nickel is used to give desirable braze/solder wettability characteristics, such as leach resistance.

Typically, the use of metal filled vias is restricted to internal circuitry, with most manufacturers design guidelines specifying the minimum permissible distance from a via to the external wall of the article or an adjacent via. This minimum distance, for example, is typically about 0.030 inch. This is required because an insufficient wall thickness between two vias or a via and the edge wall may cause fracture due to thermal expansion mismatch stresses between the metal filled via and the ceramic. Because of the high firing temperature of, for example, co-fired alumina, a high melting conductor such as molybdenum or tungsten is required for the via filling material. These metals, with a lower coefficient of thermal expansion that alumina, exhibit a thermal expansion mismatch when cooled from the sintering temperature. The thermal expansion of the via metallizing can be modified by the addition of a higher expansion inorganic filler such as alumina ceramic. However, even with filler additions, the stress is adequate to fracture a thin ceramic web between large vias or between the via and edge of the part.

Surprisingly, it has been found that vias produced according to the present invention do not exhibit detrimental stresses and do not tend to fracture the ceramic web.

When the article is a feedthrough for a hermetic package, complete wraparound metallization of the feedthrough is required to form a hermetic braze/solder seal. Very tight dimensional tolerances are required to define a braze/solderable gap between the feedthrough and the case. A fit that is too tight will hinder or prevent braze assembly. A fit that is too loose will leave a gap that is too large to fill with braze/solder. The present invention advantageously permits the machining (e.g. grinding) of the edge of the article to a desired dimension without completely removing the side metallization. This is due to the thickness of the side metallization layer.

FIG. 1 depicts a simplified version of a ceramic feedthrough according to one embodiment of the present invention, that has been produced by a process according to the present invention. The ceramic feedthrough 10 includes a first layer of ceramic 20 that is metallized on its bottom surface 22. The top surface 24 of the first layer 20 includes signal traces 26 and 28 that provide electrical communication between the interior and exterior of a hermetic package.

A second layer in the form of a rib 30 traverses the top surface 24 of the first layer substantially perpendicular to the signal traces 26 and 28. The top surface 32 of the rib 30 is fully metallized to provide a complete braze wettable surface. The ends of the rib 30 may be flared 34 to provide ceramic material around the vias 40 for structural support during the green processing steps. The vias 40 extend through both layers of the ceramic to complete a full wraparound metallization for brazing into the hermetic package.

Figure 2:
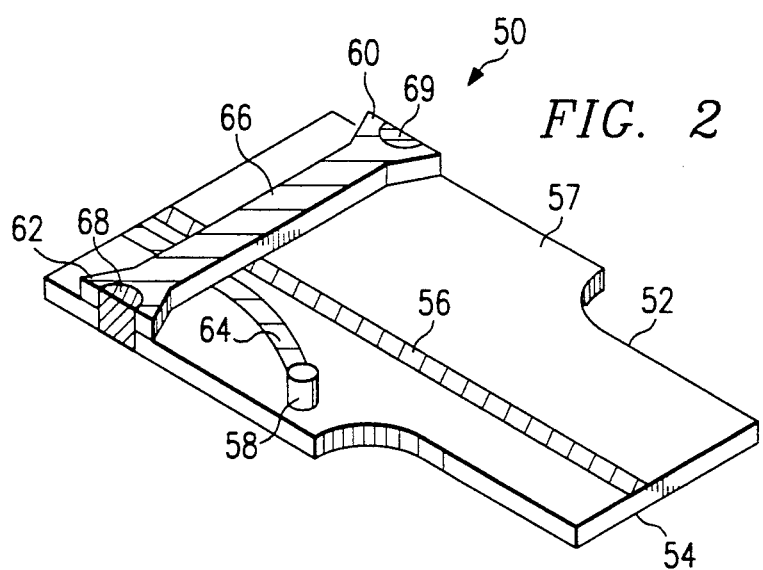
FIG. 2 illustrates a feedthrough in accordance with the present invention.

FIG. 2 illustrates a feedthrough for a hermetic package that can be fabricated according to the present invention. The feedthrough 50 includes a first layer 52 that is fully metallized on its bottom surface 54 and includes a conductive trace 56 on its top surface 57. Additionally, the top surface 57 includes a pin 58 and second metal trace 64 for electrical connection to other devices.

The feedthrough 50 includes a top rib 60 that is fully metallized on its top surface 66. The sides 62 of the rib 60 and first layer 52 comprise split vias 68, 69 that provide wraparound metallization around the feedthrough 50.

Figure 3:
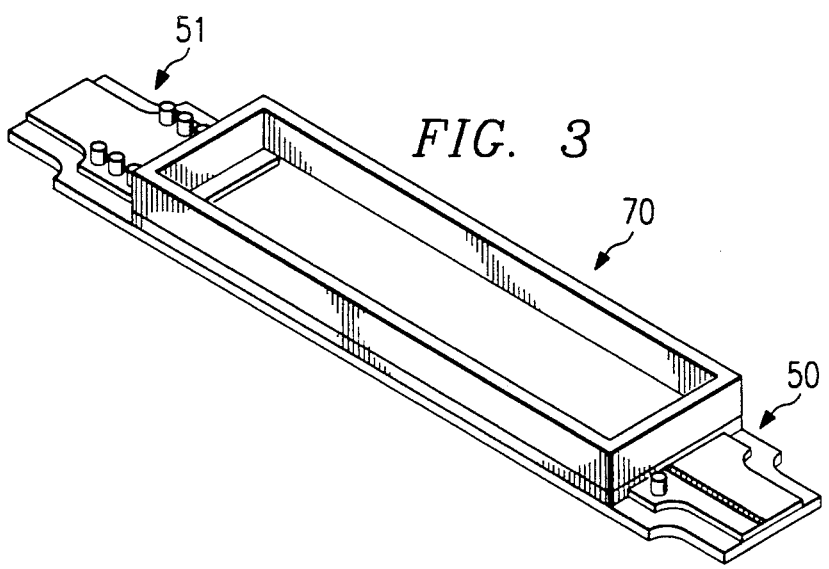
FIG. 3 illustrates a hermetic package utilizing feedthroughs fabricated in accordance with the present invention.

FIG. 3 depicts a hermetic package 70 utilizing feedthroughs 50, 51 according to the present invention. The feedthroughs 50 and 51 are brazed/soldered into the opposite ends of the package 70 to provide hermetic seals.

Thus, the present invention advantageously provides a process for forming side metallization on ceramic articles wherein post-sintering metallization steps can be eliminated. The process can advantageously provide side metallization on a plurality of articles punched from the same ceramic sheet in a cost effective and productive manner.

While various embodiments of the present invention have been described in detail, it is apparent that modifications and adaptations of those embodiments will occur to those skilled in the art. However, it is to be expressly understood that such modifications and adaptations are within the spirit and scope of the present invention.

What is claimed is:

1. A process for the fabrication of a feedthrough for a hermetic package, comprising the steps of:
    a) stacking at least two ceramic sheets to form a laminate;
    b) forming at least two vias in said laminate;
    c) substantially filling said two vias with metallization;
    d) splitting said laminate along at least two lines, said lines passing through at least a portion of said at least two vias; and
    e) metallizing said laminate to form a continuous band of metallization on the surface of said laminate and connecting said at least two vias to form a ceramic feedthrough having wraparound metallization.

2. A process recited in claim 1, further comprising the step of punching at least one of said at least two ceramic sheets to form a rib.

3. A process as recited in claim 2, wherein said rib is flared to provide support to said at least two vias.

4. A process as recited in claim 2, wherein said at least two vias are substantially rectangular.

5. A process as recited in claim 4, wherein said at least two vias have a length that is longer than the width of said rib.

6. A process as recited in claim 1, wherein said splitting step comprises the steps of scoring said laminate and mechanically separating said laminate along said score.

7. A process as recited in claim 1, wherein said at least two vias are substantially round.

8. A process as recited in claim 7, wherein said vias have a diameter of at least about 0.004 inch.

9. A process as recited in claim 1, wherein said at least two vias are split substantially through the center of said vias.

10. A process as recited in claim 1, wherein said ceramic sheets comprise ceramic material selected from the group consisting of alumina, aluminum nitride, cordierite, mullite, forsterite, ferrite, glass - ceramic and beryllia.

11. A process as recited in claim 1, wherein said metallization comprises material selected from the group consisting of tungsten, molybdenum, platinum, palladium, copper, gold, silver and mixtures thereof.

12. A process as recited in claim 11, wherein said metallization further comprises a thermal expansion adjusting material.

13. A process as recited in claim 1, wherein said at least two lines are substantially parallel.

14. A process for the fabrication of a plurality of feedthroughs for hermetic packages, comprising the steps of:
    a) forming a plurality of vias in at least two ceramic sheets;
    b) metallizing said two ceramic sheets to substantially fill at least a portion of said plurality of vias;
    c) laminating said ceramic sheets to form a laminate;
    d) splitting said laminate along a plurality of lines, said lines passing through at least a portion of said substantially filled vias to form a plurality of split vias;
    e) metallizing said laminate to form a band of metallization connecting at least two of said split vias; and
    f) sintering said laminate to form a plurality of feedthroughs for hermetic packages.

15. A process as recited in claim 14, wherein said splitting step comprises the step of cutting said laminate.

16. A process as recited in claim 14, wherein said vias are substantially rectangular.

17. A process for the fabrication of a hermetic package having a ceramic feedthrough, comprising the steps of:
    a) stacking at least two ceramic sheets to form a laminate;
    b) forming at least two vias within said laminate;
    c) substantially filling said at least two vias with metallization;
    d) metallizing said laminate to connect said at least two vias with surface metallization;
    e) splitting said laminate along at least two lines, said lines passing through at least a portion of said at least two vias to form said ceramic feedthrough having side metallization; and
    f) inserting said feedthrough into an end of a package to form a substantially hermetic package.

18. A process as recited in claim 17, wherein said inserting step includes the step of brazing said feedthrough.

19. A feedthrough for a hermetic package, comprising:
    a) at least two ceramic sheets; and
    b) two vias extending substantially through said at least two ceramic sheets, wherein said two vias are split to expose metallization contained therein and provide side metallization for said device; and
    c) a substantially continuous band of metallization on the surface of said ceramic sheets and connecting said at least two vias.

20. A multilayer ceramic device as recited in claim 19, wherein said two vias are substantially rectangular.

* * * * *